(12) United States Patent
Nishizawa et al.

(10) Patent No.: US 10,673,349 B2
(45) Date of Patent: Jun. 2, 2020

(54) POWER CONVERSION DEVICE WITH EFFICIENT COOLING STRUCTURE

(71) Applicant: HITACHI AUTOMOTIVE SYSTEMS, LTD., Ibaraki (JP)

(72) Inventors: Youhei Nishizawa, Hitachinaka (JP); Ayumu Hatanaka, Hitachinaka (JP); Takeshi Seki, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 16/472,062

(22) PCT Filed: Nov. 7, 2017

(86) PCT No.: PCT/JP2017/040033
§ 371 (c)(1),
(2) Date: Jun. 20, 2019

(87) PCT Pub. No.: WO2018/116667
PCT Pub. Date: Jun. 28, 2018

(65) Prior Publication Data
US 2020/0100377 A1 Mar. 26, 2020

(30) Foreign Application Priority Data
Dec. 22, 2016 (JP) ................................. 2016-248588

(51) Int. Cl.
*H02M 7/00* (2006.01)
*H05K 7/02* (2006.01)
(Continued)

(52) U.S. Cl.
CPC ............ *H02M 7/003* (2013.01); *H01G 17/00* (2013.01); *H05K 7/02* (2013.01); *H05K 7/209* (2013.01)

(58) Field of Classification Search
CPC ......... H02M 7/003; H05K 7/02; H01G 17/00; H01L 25/18
See application file for complete search history.

(56) References Cited

U.S. PATENT DOCUMENTS

2007/0109715 A1\* 5/2007 Azuma .................... B60K 6/48
361/299.3
2008/0049477 A1\* 2/2008 Fujino ................... H02M 7/003
363/131
(Continued)

FOREIGN PATENT DOCUMENTS

JP      2004-104860 A    4/2004
JP      2013-220029 A   10/2013
(Continued)

OTHER PUBLICATIONS

International Search Report for WO 2018/116667 A1, dated Feb. 20, 2018.

*Primary Examiner* — Yusef A Ahmed
(74) *Attorney, Agent, or Firm* — Volpe and Koenig, P.C.

(57) ABSTRACT

To improve reliability of a power conversion device with an efficient cooling structure. A power conversion device according to the present invention includes a power semiconductor module configured to convert power, a first capacitor configured to smooth the power, a conductor section forming a first power path between a power terminal and the first capacitor and a second power path between the first capacitor and the power semiconductor module, a noise filter section including a second capacitor that smooths power having a higher frequency than a frequency of the power smoothed by the first capacitor, and a cooling section forming a cooling surface, and the noise filter section is connected to the conductor section forming the first power (Continued)

path, and the conductor section forming the first power path is arranged in a space between the cooling surface and the noise filter section.

5 Claims, 6 Drawing Sheets

(51) Int. Cl.
*H05K 7/20* (2006.01)
*H01G 17/00* (2006.01)

(56) References Cited

U.S. PATENT DOCUMENTS

| | | | |
|---|---|---|---|
| 2008/0218782 A1* | 9/2008 | Seki | G06T 5/20 358/1.9 |
| 2011/0249421 A1* | 10/2011 | Matsuo | B60K 6/445 361/821 |
| 2013/0279114 A1* | 10/2013 | Nishikimi | B60L 15/007 361/699 |
| 2014/0133199 A1 | 5/2014 | Matsuo et al. | |
| 2015/0049533 A1 | 2/2015 | Nishikimi et al. | |
| 2015/0256096 A1* | 9/2015 | Nishizawa | H01G 2/04 363/131 |
| 2015/0305188 A1* | 10/2015 | Maeda | H05K 7/1432 361/728 |
| 2015/0348694 A1* | 12/2015 | Sakuma | H05K 7/20909 336/60 |
| 2016/0037654 A1* | 2/2016 | Kosuga | H02M 7/003 361/807 |
| 2016/0374229 A1* | 12/2016 | Nishikimi | H02M 7/003 |
| 2017/0005581 A1* | 1/2017 | Fukumasu | H02M 3/28 |
| 2017/0063218 A1* | 3/2017 | Nishizawa | H02M 7/003 |
| 2017/0151878 A1* | 6/2017 | Okamura | H05K 7/20 |
| 2017/0194873 A1* | 7/2017 | Takahashi | H01L 23/36 |
| 2018/0007785 A1* | 1/2018 | Kamikura | H02M 5/458 |
| 2018/0123445 A1 | 5/2018 | Nishizawa et al. | |
| 2019/0173394 A1* | 6/2019 | Miura | H02M 1/08 |
| 2019/0334440 A1* | 10/2019 | Miyazaki | H05K 7/1432 |

FOREIGN PATENT DOCUMENTS

| | | |
|---|---|---|
| JP | 2014-128084 A | 7/2014 |
| JP | 2016-15442 A | 8/2016 |
| WO | 2015/186469 A1 | 12/2015 |

* cited by examiner

POWER CONVERSION DEVICE WITH EFFICIENT COOLING STRUCTURE

TECHNICAL FIELD

The present invention relates to a power conversion device, and more particularly to a power conversion device that drives a vehicle-driving rotating electrical machine.

BACKGROUND ART

In a main circuit and a capacitor module of a power conversion device mounted on hybrid vehicles and electric vehicles, a power terminal connected to a power supply for supplying direct current power and a power semiconductor module for performing an operation to convert direct current power into alternating current power are connected by conductor section. A capacitor cell for smoothing the direct current power is connected to the conductor section.

With recent downsizing, and larger current and higher voltage of power conversion, the capacitor cell receives inflow of heat due to a power loss at the time of power conversion due to a high-temperature environment and adverse effects such as destruction and deterioration become apparent, and a structure that efficiently performs cooling is required.

The power conversion device mounted on hybrid vehicles and electric vehicles is required to take measures against electromagnetic noise (hereinafter, electro magnetic compatibility (EMC) noise)) that is generated and becomes large with advancement of the higher voltage and the larger current, and higher radio frequency of switching elements.

To suppress the EMC noise, addition of a noise filter circuit is effective. However, as an issue, impedance of a power path needs to be increased. Therefore, wiring becomes long and a cross-sectional area becomes small, and a power loss (heat generation) increases. Adverse effects such as deterioration of parts constituting a noise filter are becoming apparent due to the influence of the heat, and a structure that efficiently performs cooling is required.

Citation List
Patent Literature
PTL 1: JP 2014-128084 A

SUMMARY OF INVENTION

Technical Problem

An object of the present invention is to improve reliability of a power conversion device with an efficient cooling structure.

Solution to Problem

A power conversion device according to the present invention includes a power semiconductor module configured to convert power, a first capacitor configured to smooth the power, a conductor section forming a first power path between a power terminal and the first capacitor and a second power path between the first capacitor and the power semiconductor module, a noise filter section including a second capacitor that smooths power having a higher frequency than a frequency of the power smoothed by the first capacitor, and a cooling section forming a cooling surface, and the noise filter section is connected to the conductor section forming the first power path, and the conductor section forming the first power path is arranged in a space between the cooling surface and the noise filter section.

Advantageous Effects of Invention

According to the present invention, reliability of a power conversion device can be improved.

DESCRIPTION OF EMBODIMENTS

Figure 1:
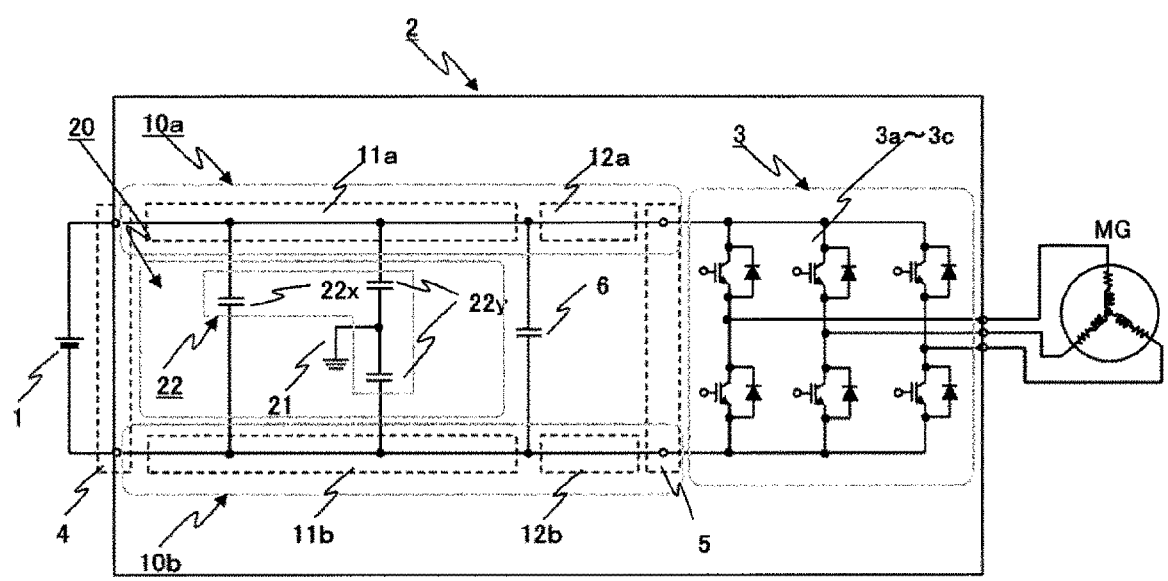
FIG. 1 is a circuit diagram regarding a switching circuit section and a noise filter section in a power conversion device.

The background art according to an embodiment of the present invention and problems according to the embodiment will be described in detail below.

In recent years, attention has been given to hybrid vehicles and electric vehicles for the purpose of reducing environmental burden and resource consumption in order to respond to fuel consumption improvement and exhaust gas regulation, and hybrid vehicles and electric vehicles are becoming internationally popular.

In response to such trends, problems of electro magnetic compatibility (EMC) noise such as electromagnetic interference to surroundings of electronic equipment for automobile and resistance to electromagnetic interference from surroundings are increasing, and measures against the problems are an issue for the electronic equipment for automobile.

Particularly in Europe, compliance with European directive 2004/104/EC (automobile EMC directive) for electronic equipment for automobile is strongly required, and EMC certification for electric vehicles themselves, and electric and electronic parts and assembled parts mounted on the vehicles is performed.

Further, harmonization of international standards has been promoted by United Nations/Economic Commission for Europe (UN/ECE), and ECE Reg.10.03 (radio interference suppression) has been established as an international standard. Further, in March 2011, addition of EMC requirements for electric vehicles and plug-in hybrid vehicles to ECE Reg.10.04 has been issued. The domestic automobile EMC law (ECE Reg.10.05) has been promulgated in August 2011. In addition, not only the laws and regulations of each country but also requirements of each manufacturer's own standard need to be coped with.

Meanwhile, a power conversion device, which is one of electric parts mounted on a vehicle, is a device that handles high voltage and large current and performs power conversion by high-speed switching operation and thus becomes a generation source of the EMC noise. In addition, operation time and operation condition (high output torque condition) of a motor driven by the power conversion device tend to increase in the future, and the EMC noise becomes larger with further higher voltage and larger current of the power conversion, and the higher radio frequency of the switching element by improvement of the loss, and measures are considered to be essential.

To suppress the EMC noise generated from the power conversion device, a measure to arrange a noise filter module on an output side of a power terminal from which the noise caused by the switching operation flows out is effective. Meanwhile, as an issue, wiring from the switching element to the input of the power terminal becomes long and the cross-sectional area becomes small, and the power loss (heat generation) increases, from a point that a space for arranging parts such as a capacitor and a core constituting a noise filter circuit is required, and a point that the impedance of a power path needs to be increased to suppress the noise from the switching element to the input of the power terminal.

Therefore, adverse effects such as destruction and deterioration of parts constituting a noise filter are becoming apparent due to the influence of the generated heat, and a structure that efficiently cools the heat generation is required. To solve the problem, in the present embodiment, a power path that becomes a heat generation source is arranged close to a water channel surface of an inverter casing, and a noise filter module is arranged in a space above the inverter casing, thereby improving heat dissipation performance and enabling high output of the inverter. In addition, since the amount of heat flowing into the noise filter module from the power path via a connection terminal is reduced, effect of thermal resistance/impedance of the connection terminal to the degree of freedom in designing wiring impedance for improving a noise filter function, such as forming the connection terminal with low impedance and PN equal length, can be obtained.

First Embodiment

FIG. 1 is a circuit diagram regarding a switching circuit section 3 and a noise filter section in a power conversion device 2.

The switching circuit section 3 converts direct current power of a high-voltage battery 1 into alternating current power for driving a motor generator MG.

A power semiconductor module 3a constitutes a part of the switching circuit section 3 and is connected to a U phase of the motor generator MG. A power semiconductor module 3b constitutes a part of the switching circuit section 3 and is connected to a V phase of the motor generator MG. A power semiconductor module 3c constitutes a part of the switching circuit section 3 and is connected to a Q phase of the motor generator MG. The first capacitor 6 smooths the direct current power to be supplied to the switching circuit section 3.

A conductor section 10a and a conductor section 10b are connected to the high-voltage battery 1 and the power semiconductor modules 3a to 3c. Note that the conductor section 10a constitutes a positive electrode-side conductor section and the conductor section 10b constitutes a negative electrode-side conductor section.

A power terminal 4 connects the conductor section 10a and the conductor section 10b to the high-voltage battery 1. A power side terminal 5 connects the conductor section 10a and the conductor section 10b to the switching circuit section 3.

A first power path 11a is a positive electrode-side power path between the power terminal 4 and the first capacitor 6 in the conductor section 10a. A first power path 11b is a negative electrode-side power path between the power terminal 4 and the first capacitor 6 in the conductor section 10b.

A second power path 12a is a positive electrode-side power path between the first capacitor 6 and the power semiconductor modules 3a to 3c in the conductor section 10a. A second power path 12b is a negative electrode-side power path between the first capacitor 6 and the power semiconductor modules 3a to 3c in the conductor section 10b.

A noise filter section 20 is constituted by a ground 21 in the circuit of the power conversion device 2 and a second capacitor 22 that smooths power having a frequency higher than a frequency of the power smoothed by the first capacitor 6.

An X capacitor 22x is a capacitor connected between a positive electrode and a negative electrode of the conductor section 10 and which smooths power. A Y capacitor 22y is a capacitor connected between the conductor a 10a and the ground 21 and between the conductor section 10b and the ground 21, and which smooths power.

Figure 2A:
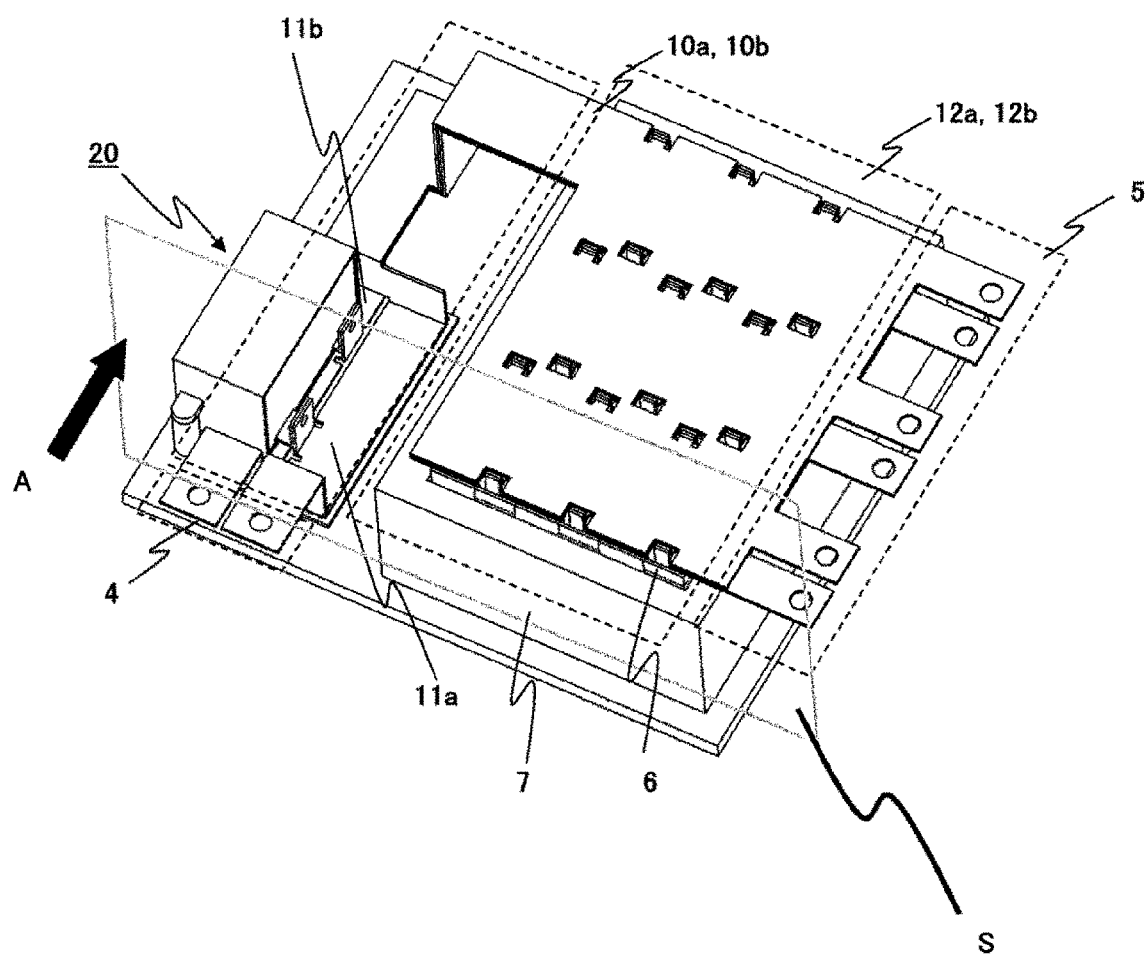
FIG. 2(a) is a partial perspective view of a power conversion device 2 for describing a cooling structure of a noise filter section 20.
Figure 2B:
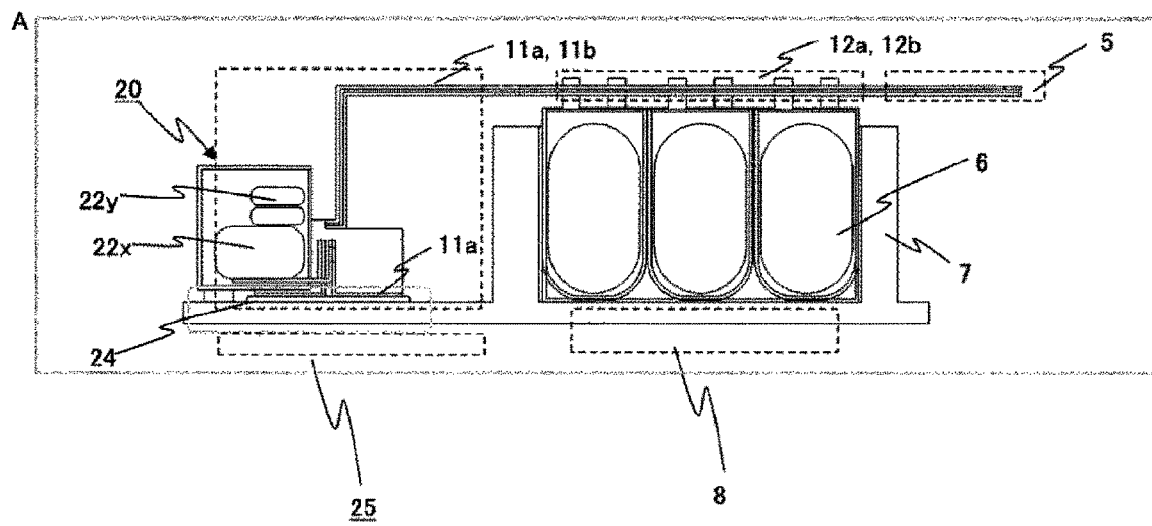
FIG. 2(b) is a cross section of a surface S in FIG. 2(a) as viewed in a direction of an arrow A.

FIG. 2(a) is a partial perspective view of the power conversion device 2 for describing cooling structure of the noise filter section 20. FIG. 2(b) is a cross section of a surface S in FIG. 2(a) as viewed in a direction of an arrow A.

A case 7 forms a space in which the first capacitor 6 is accommodated and forms a space in which the noise filter section 20 is arranged. The case 7 is mainly constituted by metal, specifically by aluminum.

A flow path 8 is formed at position facing a bottom portion of the first capacitor 6. The flow path 8 may be provided to be formed inside the case 7 or may be configured by a member different from the case 7 and provided to be connected to the case 7.

A cooling surface 24 is connected to the first power path 11a of the conductor section 10a and the first power path 11b of the conductor section 10b in the case 7. A cooling section 25 is formed at a position facing the cooling surface 24. Note that the cooling section 25 may be a flow path connected to the flow path 8.

Figure 3A:
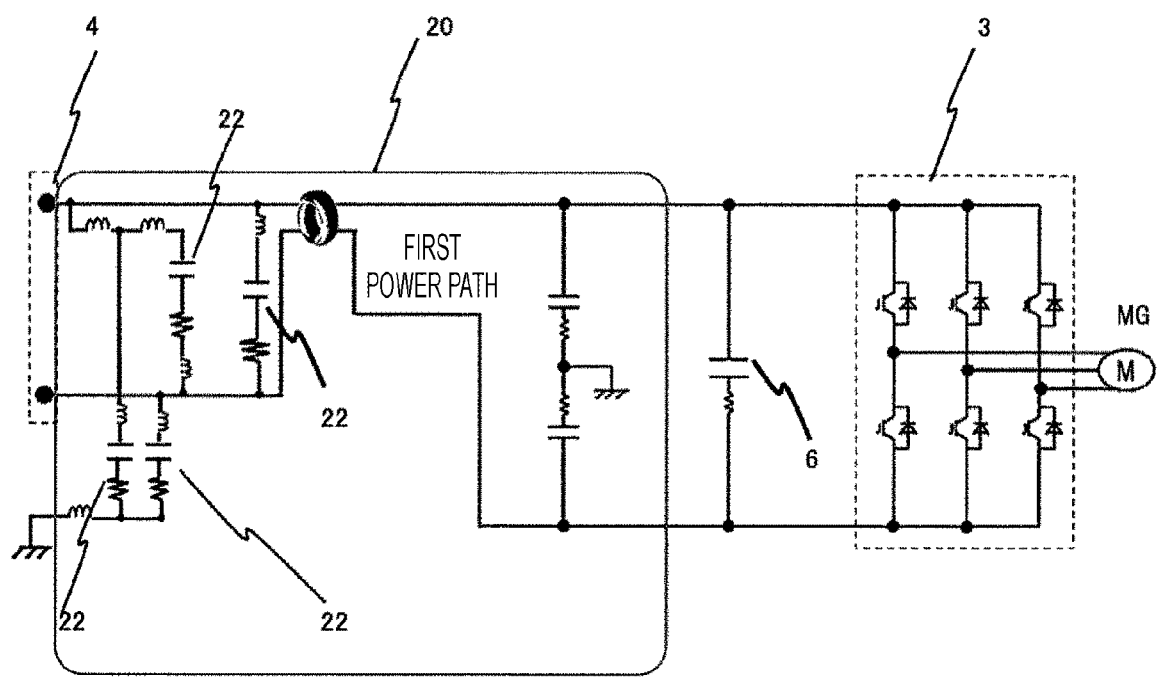
FIG. 3(a) is a circuit diagram illustrated to recognize an impedance component existing in the noise filter section 20 illustrated in FIG. 1.
Figure 3B:
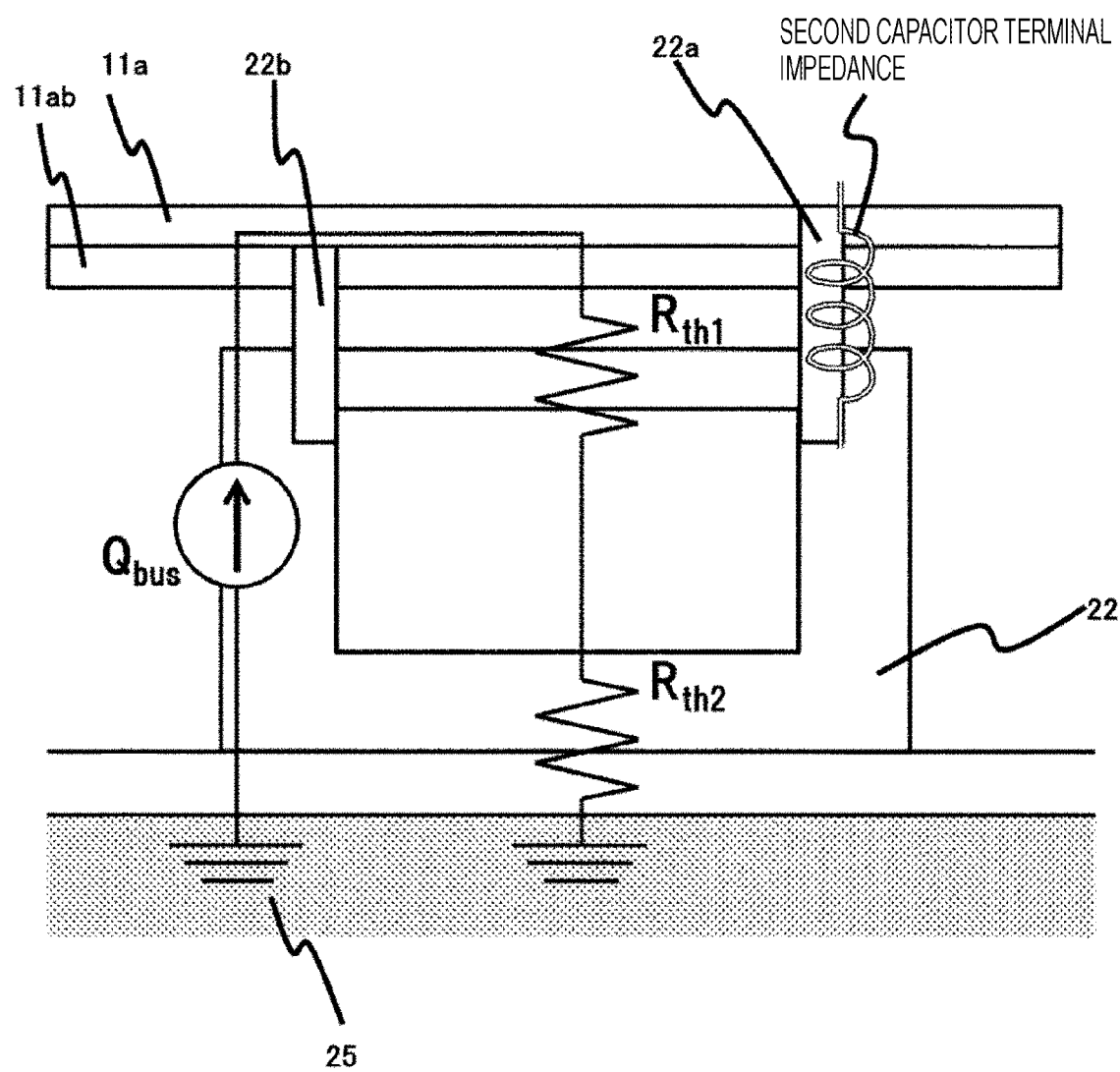
FIG. 3(b) is a conceptual diagram in which a second capacitor 25 is configured to be sandwiched between a first power path 11a of a conductor section 10a and a first power path 11b of a conductor section 10b, and a cooling section 25, as a comparative example.
Figure 3C:
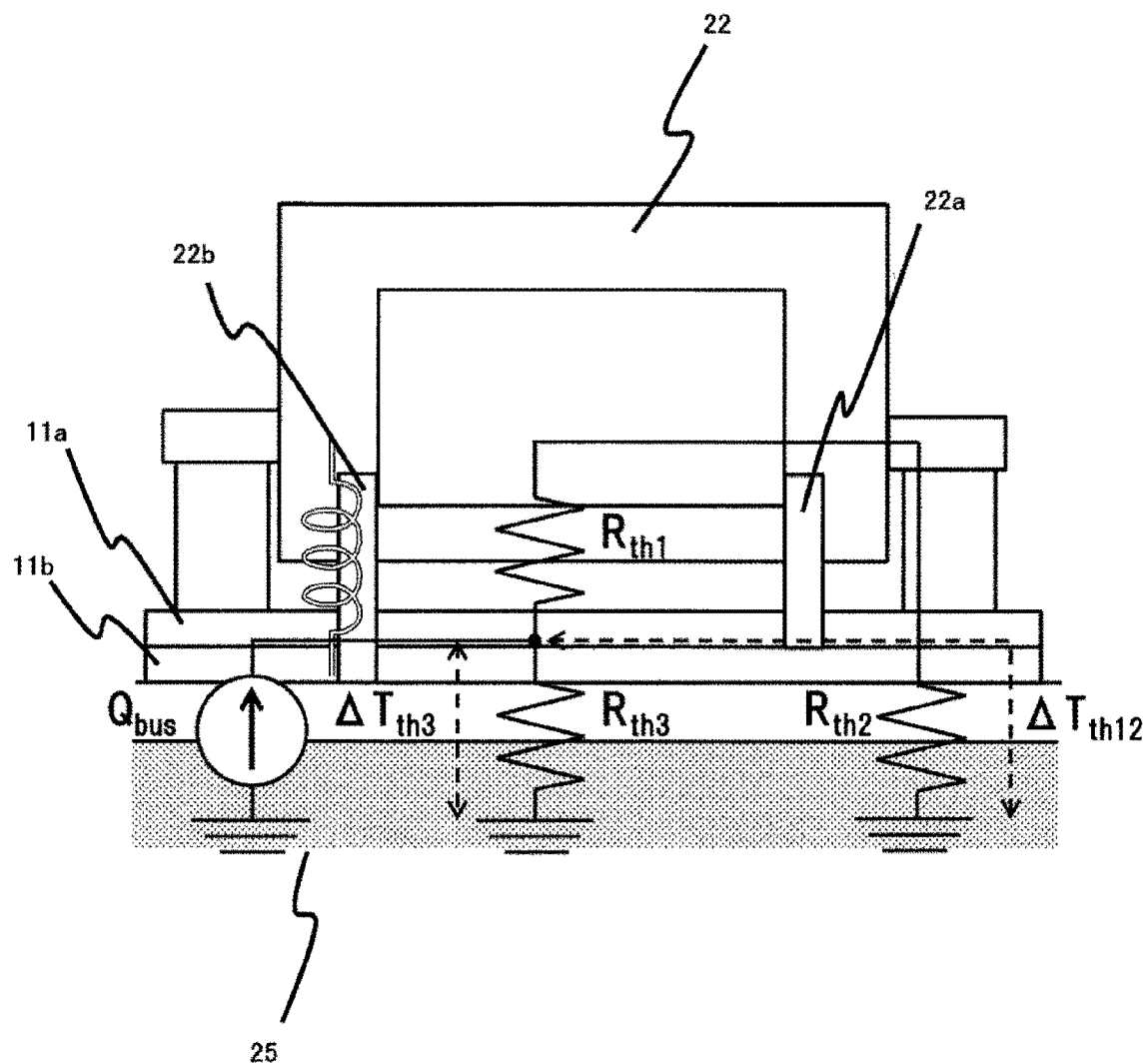
FIG. 3(c) illustrates the present embodiment and is a conceptual diagram in which a first power path 11a of a conductor section 10a and a first power path 11b of a conductor section 10b are configured to be sandwiched between a second capacitor 25 and a cooling section 25.

FIG. 3(a) is a circuit diagram illustrated to recognize an impedance component existing in the noise filter section 20 illustrated in FIG. 1. FIG. 3(b) is a conceptual diagram in which a second capacitor 25 is configured to be sandwiched between a first power path 11a of a conductor section 10a and a first power path 11b of a conductor section 10b, and a cooling section 25, as a comparative example. FIG. 3(c) illustrates the present embodiment and is a conceptual diagram in which the first power path 11a of the conductor section 10a and the first power path 11b of the conductor section 10b are configured to be sandwiched between the second capacitor 25 and the cooling section 25.

In the comparative example, heat generation of the first power path 11a and the first power path 11b is dissipated to the cooling section 25 via the second capacitor 22 that is a constituent component of the noise filter section 20. That is, the heat generation of the first power path 11a and the first power path 11b is through a thermal resistance Rth1 of the second capacitor 22 and a thermal resistance Rth2 from the second capacitor 22 to the cooling section 25.

Note that a capacitor terminal 22a connects the conductor section 10a provided with the first power path 11a and the second capacitor 22 and a capacitor terminal 22b connects the conductor section 10b provided with the first power path 11b and the second capacitor 22.

In contrast, in the present embodiment illustrated in FIG. 3(c), heat generation Qbus of the first power path 11a first power path 11b is dissipated to a heat dissipation path (thermal resistance Rth1+Rth2) via the second capacitor 22 that is similar to FIG. 3(b) and a heat dissipation path (thermal resistance Rth3) directly connected from the first power path 11a and the first power path 11b to the cooling section 25 in parallel.

Here, the thermal resistance Rth1+Rth2 is compared with the thermal resistance Rth3, and Rth3<<Rth1+Rth2 is established with the structure in FIG. 3(c) in which the heat dissipation path has a wider area and is connected with a short distance. For example, in a case where Rth3=(Rth1+Rth2)/10, the following simultaneous equations 1 to 4 are solved, where a temperature rise of the first power path 11a and the first power path 11b to the cooling section 25 in FIG. 3(b) $\Delta Tth12$, a temperature rise of the thermal resistance Rth1+Rth2 in FIG. 3(c) is $\Delta Tth12'$, and a temperature rise of the thermal resistance Rth3 is $\Delta Tth3$.

$$Q\text{bus}=\Delta Tth12/(Rth1+Rth2) \quad \text{(Equation 1)}$$

$$Q\text{bus}=(\Delta Tth12'/(Rth1+Rth2))+(\Delta Tth3/Rth3) \quad \text{(Equation 2)}$$

$$\Delta Tth12'=\Delta Tth3 \quad \text{(Equation 3)}$$

$$Rth3=(Rth1+Rth2)/10 \quad \text{(Equation 4)}$$

As a result, $\Delta Tth12'=\Delta Tth12/11$ is obtained, and thus it is found that the temperature rise from the first power path 11a and the first power path 11b to the cooling section 25 is decreased to, for example, 1/11 in FIG. 3(c) as compared with FIG. 3(b), and the heat dissipation performance is improved.

Further, since the temperature rise $\Delta Tth2$ of the second capacitor 22 shares $\Delta Tth12$ by the ratio the thermal resistance Rth1 and the thermal resistance Rth2, conventionally, $\Delta Tth2$ has been designed to be equal to or less than heatproof temperature 105° C. of a capacitor element of the second capacitor 22 by setting Rth1>>Rth2.

Here, as a technique for making the thermal resistance Rth1 large, an electrical connection structure between the first power paths 11a and 11b to the second capacitor 22, for example, cross-sectional areas of the capacitor terminal 22a and the capacitor terminal 22b have been made small and a wiring length has been made long. However, impedance Ztm is also increased at the same time with an increase. in the thermal resistance, which, binders inflow of a noise current into the second capacitor 22 and may deteriorate the noise filter function.

In contrast, in the present embodiment, the temperature rise: $\Delta Tth12'$ itself of the first power 11a and the first power path 11b to the cooling section 25 is decreased by the addition of the thermal resistance Rth3. Therefore, the effect on $\Delta Tth2$ due to making the thermal resistance Rth1 large is decreased accordingly.

Therefore., the thermal resistance and the impedance of the capacitor terminal 22a and the capacitor terminal 22b can be made smaller than the conventional case, and $\Delta Tth2$ can be made equal to or less than the heatproof temperature 105° C. of the capacitor without deteriorating the noise filter function.

Further, in other words, the effect on the impedance Ztm of the capacitor terminal 22a and the capacitor terminal 22b with respect to the temperature rise in the noise filter section 20 is decreased. The degree of freedom in designing a wiring structure for improving the noise filter function, such as forming the electrical connection from the first power path 11a and the first power path 11b to the second capacitor 22 with low impedance and PN equal length, is obtained.

In addition, the conductor section 10a illustrated in FIG. 2(a) is formed such that the cross-sectional area of the first power path 11a becomes smaller than the cross-sectional area of the second power path 12a. Similarly, the conductor section 10b is formed such that the cross-sectional area of the first power path 11b becomes smaller than the cross-sectional area of the second power path 12b. As a result, the first power path 11a and the first power path 11b are made to have high impedance, and transmission of radio-frequency voltage variation at the time of direct current-alternating current conversion operation of the switching circuit section 3 to the power terminal 4 can be suppressed. Therefore, the noise filter function of the noise filter section 20 can be improved.

Figure 2C:
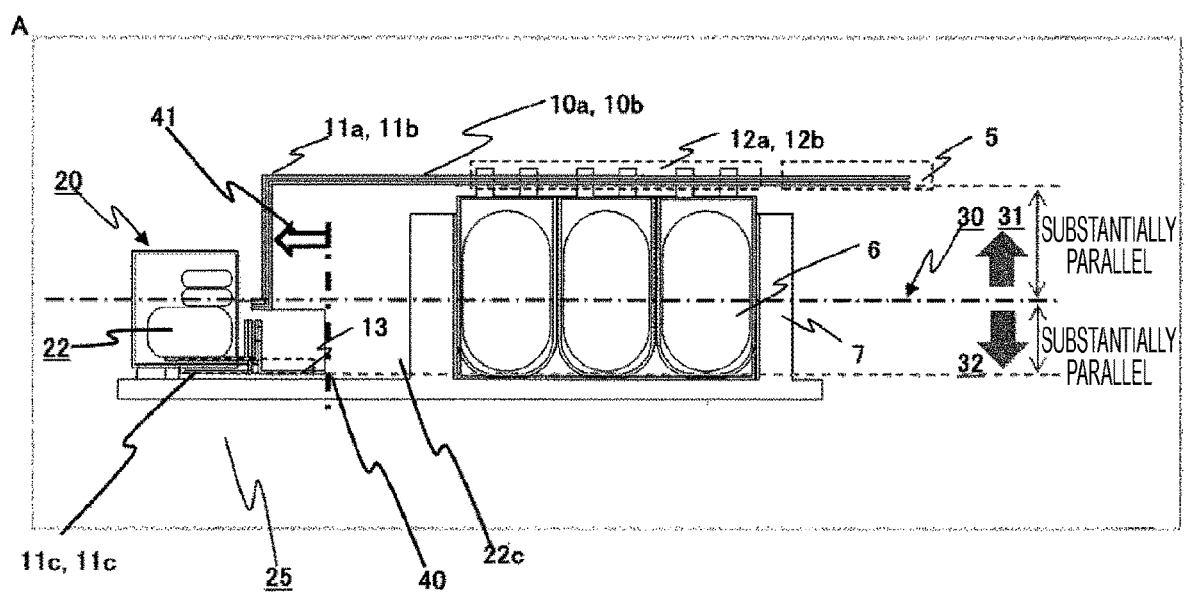
FIG. 2(c) is a cross-sectional view for describing an arrangement of a first capacitor 6 and the noise filter section 20.

FIG. 2(c) is a cross-sectional view for describing an arrangement of the first capacitor 6 and the noise filter section 20.

A line segment 30 is a line segment connecting a substantially central portion of the first capacitor 6 and a substantially central portion of the noise filter section 20. Note that the substantially central portion of the first capacitor 6 and the substantially central portion of the noise filter section 20 are respective centroid positions.

A space 31 is a space on one side with respect to the first line segment 30 as a boundary and a space 32 is space on the other side opposite to the space 31 with respect to the first line segment 30 as a boundary.

In the present embodiment, a first connection section between the first capacitor 6 and the conductor section 10a and the conductor section 10a is provided on the space 31 side, and a second connection section between the noise filter section 20 and the conductor section 10a and the conductor section 10a is provided on the space 31 side. As a result, the distance between the first connection section and the second connection section is larger than a case where the first connection section and the second connection section are provided in the space 31.

Here, capacitive coupling C and magnetic coupling M formed between the first power paths 11a and 11b and the second power paths 12a and 12b are expressed by the following equations 5 and 6. Here, $\varepsilon_0$: vacuum permittivity, $\mu_0$: vacuum permeability, S: a facing area between the first and second power paths, and d: a distance between the first and second power paths.

$$\text{The capacitive coupling } C=\varepsilon_0*(S/d) \quad \text{(Equation 5)}$$

$$\text{The capacitive coupling } M=\mu_0*(S/d) \quad \text{(Equation 6)}$$

Both the capacitive coupling C and the magnetic coupling M are in inverse proportion to the distance d between the first power paths 11a and 11b and the second power paths 12a and 12b. Further, a noise component caused by radio-frequency voltage variation at the time of direct current-alternating current conversion operation of switching circuit section 3 propagates through the space due to the capacitive coupling C and the magnetic coupling M. Therefore, in a case where the distance between the first connection section and the second connection section is made large according to the present embodiment, the noise propagating from the second power paths 12a and 12b to the first power paths 11a and 11b via the space can be suppressed and the noise filter function can be improved.

As illustrated in FIG. 2(c), the first power paths 11a and 11b are formed such that faces 11d and 11d of the first power paths 11a and 11b where the connection section with the noise filter section 20 is provided become substantially parallel to the line segment 30, and the second power paths 12a and 12b are formed such that faces 12c and 12d of the second power paths 12a and 12b where the connection section with the first capacitor 6 is provided become substantially parallel to the line segment 30. With the structure, the first power paths 11a and 11b where the connection section with the noise filter section 20 is provided can have a small influence on the noise radiated from the switching circuit section 3.

Further, as illustrated in FIG. 2(c), an end portion of the first power paths 11a and 11b, the end portion being closest to the second power paths 12a and 12b, is defined as a first end portion 40. The noise filter section 20 is arranged at a position in a direction 41 away from the second power paths 12a and 12b and separated from the first end portion 40.

In a case where the second capacitor 22 constituting the noise filter section 20 is arranged in a direction approaching the second power paths 12a and 12b (a position 22c of the comparative example in FIG. 2(c)), the distance between the second capacitor 22 and the second power paths 12a and 12b is defined as d1.

The capacitive coupling is defined as C1 and the magnetic coupling is defined as M1 in the case where the second capacitor 22 is at the position 22c of the comparative example.

d2>d1, C2<C1, and M2<M1 are established where the distance between the second capacitor 22 and the second power paths 12a and 12b is d2, the capacitive coupling is C2, and the magnetic coupling is M2 in the case where the second capacitor 22 is at the position illustrated in FIG. 2(c). Therefore, the noise propagating from the second power paths 12a and 12b to the second capacitor 22 via the space can be suppressed and the noise filter function can be improved.

In addition, the first power paths 11a and 11b of the conductor sections 10a and 10b are in contact with a heat dissipating member 13 in contact with the cooling section 25. As a result, the cooling performance of the first power paths 11a and 11b can be improved.

Reference Signs List
1 high-voltage battery
2 power conversion device
3 switching circuit section
3a power semiconductor module
3b power semiconductor module
4 power terminal
6 first capacitor
7 case
8 flow path
10a conductor section
10b conductor section
11a first power path
11b first power path
11d face
11d face
12a second power path
12b second power path
20 noise filter section
21 ground
22 second capacitor
22a capacitor terminal
22b capacitor terminal
22c position of comparative example
24 cooling surface
25 cooling section
30 line segment
31 space
32 space
40 first end portion
41 direction away from second power paths 12a and 12b

The invention claimed is:

1. A power conversion device comprising:
a power semiconductor module configured to convert power;
a first capacitor configured to smooth the power;
a conductor section forming a first power path between a power terminal and the first capacitor and a second power path between the first capacitor and the power semiconductor module;
a noise filter section including a second capacitor that smooths power having a higher frequency than a frequency of the power smoothed by the first capacitor; and
a cooling section forming a cooling surface, wherein
the noise filter section is connected to the conductor section forming the first power path, and
the conductor section forming the first power path is arranged in a space between the cooling surface and the noise filter section,
wherein, in a cross section of the power conversion device:
a line section connecting a substantially central portion of the first capacitor and a substantially central portion of the noise filter section is defined as a first line segment,
a connection section between the first power path and the noise filter section is arranged on one side with respect to the first line segment, and
the second power path is arranged on the other side with respect to the first line segment, and
wherein
the first power path is formed such that a face of the first power path where the connection section between the first power path and the noise filter section is provided becomes substantially parallel to the first line segment, and
the second power path is formed such that a face of the second power path where a connection section between the second power path and the first capacitor is provided becomes substantially parallel to the first line segment.

2. The power conversion device according to claim 1, wherein
a cross-sectional area of the first power path of the conductor section is smaller than a cross-sectional area of the second power path.

3. The power conversion device according to claim 1, wherein
an end portion of the first power path, the end portion being closest to the second power path, is defined as a first end portion, and
the noise filter section is arranged at a position in a direction away from the second power path and separated from the first end portion.

4. The power conversion device according to claim 1, further comprising:
a heat dissipating member arranged between the conductor section forming the first power path and the cooling surface and being in contact with the conductor section and the cooling surface.

5. A power conversion device comprising:
a power semiconductor module configured to convert power;
a first capacitor configured to smooth the power;
a conductor section forming a first power path between a power terminal and the first capacitor and a second power path between the first capacitor and the power semiconductor module;
a noise filter section including a second capacitor that smooths power having a higher frequency than a frequency of the power smoothed by the first capacitor; and
a cooling section forming a cooling surface,
wherein
the noise filter section is connected to the conductor section forming the first power path, and
the conductor section forming the first power path is arranged in a space between the cooling surface and the noise filter section,
wherein, in a cross section of the power conversion device:
a line section connecting a substantially central portion of the first capacitor and a substantially central portion of the noise filter section is defined as a first line segment,
a connection section between the first power path and the noise filter section is arranged on one side with respect to the first line segment, and
the second power path is arranged on the other side with respect to the first line segment, and
wherein
an end portion of the first power path, the end portion being closest to the second power path, is defined as a first end portion, and
the noise filter section is arranged at a position in a direction away from the second power path and separated from the first end portion.

\* \* \* \* \*